US012588174B2

(12) United States Patent
Liu et al.

(10) Patent No.: US 12,588,174 B2
(45) Date of Patent: Mar. 24, 2026

(54) ELECTRONIC DEVICE

(71) Applicant: Qisda Corporation, Taoyuan City (TW)

(72) Inventors: Yu-Chen Liu, Taoyuan City (TW); Yung-Tsun Hsieh, Taoyuan City (TW)

(73) Assignee: Qisda Corporation, Taoyuan City (TW)

( * ) Notice: Subject to any disclaimer, the term of this patent is extended or adjusted under 35 U.S.C. 154(b) by 207 days.

(21) Appl. No.: 18/407,404

(22) Filed: Jan. 8, 2024

(65) Prior Publication Data

US 2024/0276688 A1     Aug. 15, 2024

(30) Foreign Application Priority Data

Feb. 10, 2023     (CN) .......................... 202310095931.3

(51) Int. Cl.
*H05K 7/20* (2006.01)
*G06F 1/20* (2006.01)

(52) U.S. Cl.
CPC ......... *H05K 7/20972* (2013.01); *G06F 1/206* (2013.01); *H05K 7/20172* (2013.01)

(58) Field of Classification Search
CPC .......... H05K 7/20972; H05K 7/20172; H05K 7/20145; H05K 7/20136; H05K 7/20963; H05K 5/0213; H05K 5/0217; H05K 7/20154; H05K 7/20954; G06F 1/203; G06F 1/20; G06F 1/206; G06F 1/1601; G06F 1/1637; G06F 2200/201; G06F 1/1616; G06F 1/1626; G06F 1/1658; G06F 1/181; G06F 2200/1612; Y10S 345/905; G02F 1/133385; G02F 1/133308; G02F 1/133628; G09F 9/35
See application file for complete search history.

(56) References Cited

U.S. PATENT DOCUMENTS

| | | | | |
|---|---|---|---|---|
| 6,493,440 | B2 * | 12/2002 | Gromatzky | ....... G02F 1/133385 379/161 |
| 7,667,968 | B2 * | 2/2010 | Moorer | .............. H05K 7/20972 52/27 |
| 8,125,778 | B2 * | 2/2012 | Miyoshi | ............. H05K 7/20145 361/695 |
| 8,472,174 | B2 * | 6/2013 | Idems | ................ H05K 7/20972 361/679.21 |
| 9,479,212 | B1 * | 10/2016 | Garcia | .................... G06F 1/189 |

(Continued)

FOREIGN PATENT DOCUMENTS

TW           I437950           5/2014

*Primary Examiner* — Michael A Matey

(57) ABSTRACT

An electronic device includes a body and a heat dissipation module. The body includes a display, and the display has a display surface. The heat dissipation module is disposed on the display. The heat dissipation module includes a casing and at least one first fan. The casing has a first opening. The first opening faces the display surface. The first fan is disposed in the casing, and the first fan includes an air inlet portion and an air outlet portion. The air outlet portion faces the first opening, wherein an airflow generated by the first fan flows out of the casing from the air outlet portion via the first opening to flow to the display surface. An ambient air outside the casing flows into the air inlet portion of the first fan via the first opening.

20 Claims, 6 Drawing Sheets

(56) References Cited

U.S. PATENT DOCUMENTS

| | | | |
|---|---|---|---|
| 2006/0082271 A1* | 4/2006 | Lee | F21V 29/763 |
| | | | 313/35 |
| 2006/0164804 A1* | 7/2006 | Kim | H05K 7/20972 |
| | | | 361/688 |
| 2007/0103864 A1* | 5/2007 | Kim | F04D 17/04 |
| | | | 361/679.48 |
| 2007/0103866 A1* | 5/2007 | Park | H05K 7/20972 |
| | | | 361/679.48 |
| 2007/0103909 A1* | 5/2007 | Park | H05K 7/20972 |
| | | | 362/294 |
| 2009/0086430 A1* | 4/2009 | Kang | G02F 1/133385 |
| | | | 165/185 |
| 2009/0126914 A1* | 5/2009 | Dunn | G02F 1/13306 |
| | | | 361/695 |
| 2014/0235156 A1* | 8/2014 | Li | G06F 1/203 |
| | | | 454/184 |
| 2015/0017905 A1* | 1/2015 | Li | H04B 1/3888 |
| | | | 454/184 |
| 2021/0051823 A1* | 2/2021 | Naghib Lahouti | G06F 1/203 |
| 2021/0173455 A1* | 6/2021 | Kulkarni | G06F 1/203 |
| 2021/0191483 A1* | 6/2021 | Saravis | G06F 1/206 |

* cited by examiner

ELECTRONIC DEVICE

CROSS-REFERENCE TO RELATED APPLICATION

This application claims the priority benefit of China application serial no. 202310095931.3, filed on Feb. 10, 2023. The entirety of the above-mentioned patent application is hereby incorporated by reference herein and made a part of this specification.

BACKGROUND OF THE INVENTION

Field of the Invention

The invention relates to an electronic device, and in particular to an electronic device of an AIO computer.

Description of Related Art

Generally speaking, when a user uses an electronic device, the ambient temperature may be higher, making it difficult for the electronic device to dissipate heat. For example, computers or screens used outdoors may generate high temperatures when exposed to the sun, especially the display surface of the screen is prone to heat accumulation, so additional heat dissipation methods are needed to prevent electronic devices from being overheated and damaged.

SUMMARY OF THE INVENTION

The invention provides an electronic device, the heat dissipation module of which may dissipate heat on the display surface of the display.

An electronic device of the invention includes a body and a heat dissipation module. The body includes a display, and the display has a display surface. The heat dissipation module is disposed on the display. The heat dissipation module includes a casing and at least one first fan. The casing has a first opening. The first opening faces the display surface. The first fan is disposed in the casing, and the first fan includes an air inlet portion and an air outlet portion. The air outlet portion faces the first opening, wherein an airflow generated by the first fan flows out of the casing from the air outlet portion via the first opening to flow to the display surface. An ambient air outside the casing flows into the air inlet portion of the first fan via the first opening.

In an embodiment of the invention, the casing has at least one second opening, and an ambient air outside the casing flows into the at least one air inlet portion of the at least one first fan via the at least one second opening.

In an embodiment of the invention, an airflow direction of the heat dissipation module flowing in via the at least one second opening is perpendicular to an airflow direction of the heat dissipation module flowing out of the first opening.

In an embodiment of the invention, an area of the at least one second opening is less than an area of the first opening.

In an embodiment of the invention, the casing has a first side cover and a second side cover perpendicular to each other, the first side cover is parallel to the display surface and stacked on the at least one air inlet portion of the at least one first fan, the second side cover is extended along a normal direction of the display surface and connected to the first side cover, and the first opening is located at the second side cover.

In an embodiment of the invention, the casing has a third side cover and a fourth side cover opposite to each other, and the third side cover and the fourth side cover are connected to two opposite sides of the first side cover and perpendicular to the display surface and the second side cover.

In an embodiment of the invention, the heat dissipation module further includes two first retaining walls disposed in the casing.

In an embodiment of the invention, a quantity of the at least one second opening is two, the two second openings are respectively disposed at the third side cover and the fourth side cover, the two first retaining walls are respectively connected to peripheral edges of the two second openings, and the two first retaining walls are respectively inclined to the third side cover and the fourth side cover.

In an embodiment of the invention, the body further includes a chassis and a second fan, the chassis is connected to the display and located at an opposite side of the display surface, and the second fan is disposed in the chassis.

In an embodiment of the invention, the chassis includes an air inlet and an air outlet, the air outlet is located at an end of the chassis adjacent to the heat dissipation module, and the air inlet is located at another end of the chassis away from the heat dissipation module, wherein an airflow is adapted to flow into the chassis from the air inlet and flow out from the chassis via the air outlet.

In an embodiment of the invention, the display further includes an air inlet slot, the air inlet slot is disposed at an outer periphery of the display surface and located between the display surface and the first opening, the display is in an air communication state with the chassis via the air inlet slot, the chassis includes an air outlet, and the air outlet is located at an end of the chassis away from the heat dissipation module, wherein an airflow is adapted to flow into the body from the air inlet slot and flow out from the chassis via the air outlet.

In an embodiment of the invention, the at least one first fan is a centrifugal first fan.

In an embodiment of the invention, the at least one first fan includes at least one volute and at least one impeller, and the at least one impeller is rotatably assembled in the at least one volute.

In an embodiment of the invention, a quantity of the at least one air inlet portion is two, and the two air inlet portions are opposite to each other.

In an embodiment of the invention, a quantity of the at least one first fan is a plurality, and the first fans are arranged parallel to a side of the display surface.

In an embodiment of the invention, the air outlet portions of the first fans are arranged at intervals with gaps between the air outlet portions, and an ambient air outside the casing flows into the air inlet portions of the first fans from the first opening through the gaps.

In an embodiment of the invention, the display includes a frame, the frame surrounds the display surface, and the heat dissipation module is disposed on the frame.

In an embodiment of the invention, the electronic device is an AIO computer.

In an embodiment of the invention, the display surface is a touch display surface.

In an embodiment of the invention, an air outlet angle of the at least one air outlet portion is biased towards the display surface.

Based on the above, in the electronic device of the invention, the heat dissipation module is disposed above the display, and the airflow generated by the first fan of the heat dissipation module flows out of the casing after passing through the first opening from the air outlet portion to flow towards the display surface of the display. In this way, the display surface of the display may be directly cooled to achieve the effect of heat dissipation.

In order to make the aforementioned features and advantages of the disclosure more comprehensible, embodiments accompanied with figures are described in detail below.

DESCRIPTION OF THE EMBODIMENTS

Figure 1:
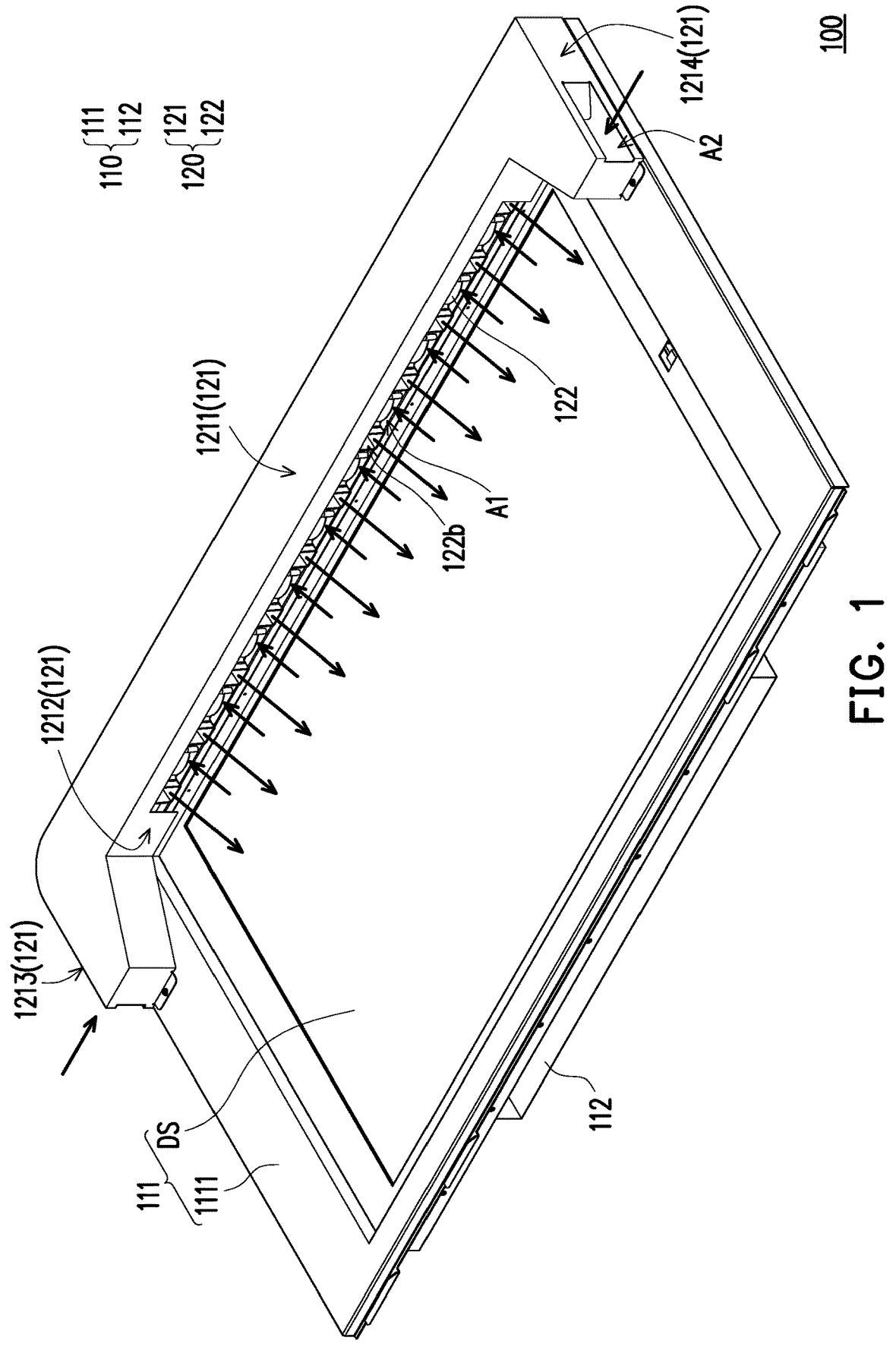
FIG. 1 is a schematic perspective view of an electronic device of an embodiment of the invention.

FIG. 1 is a schematic perspective view of an electronic device of an embodiment of the invention. Please refer to FIG. 1, an electronic device 100 of the present embodiment includes a body 110 and a heat dissipation module 120. The body 110 includes a display 111. The display 111 includes a frame 1111 and has a display surface DS. The frame 1111 surrounds the display surface DS, and the heat dissipation module 120 is disposed on the frame 1111 of the display 111, but the invention is not limited thereto. Here, the electronic device 100 is, for example, an AIO computer, and the display surface DS is a touch display surface, but the invention is not limited thereto.

Figure 2:
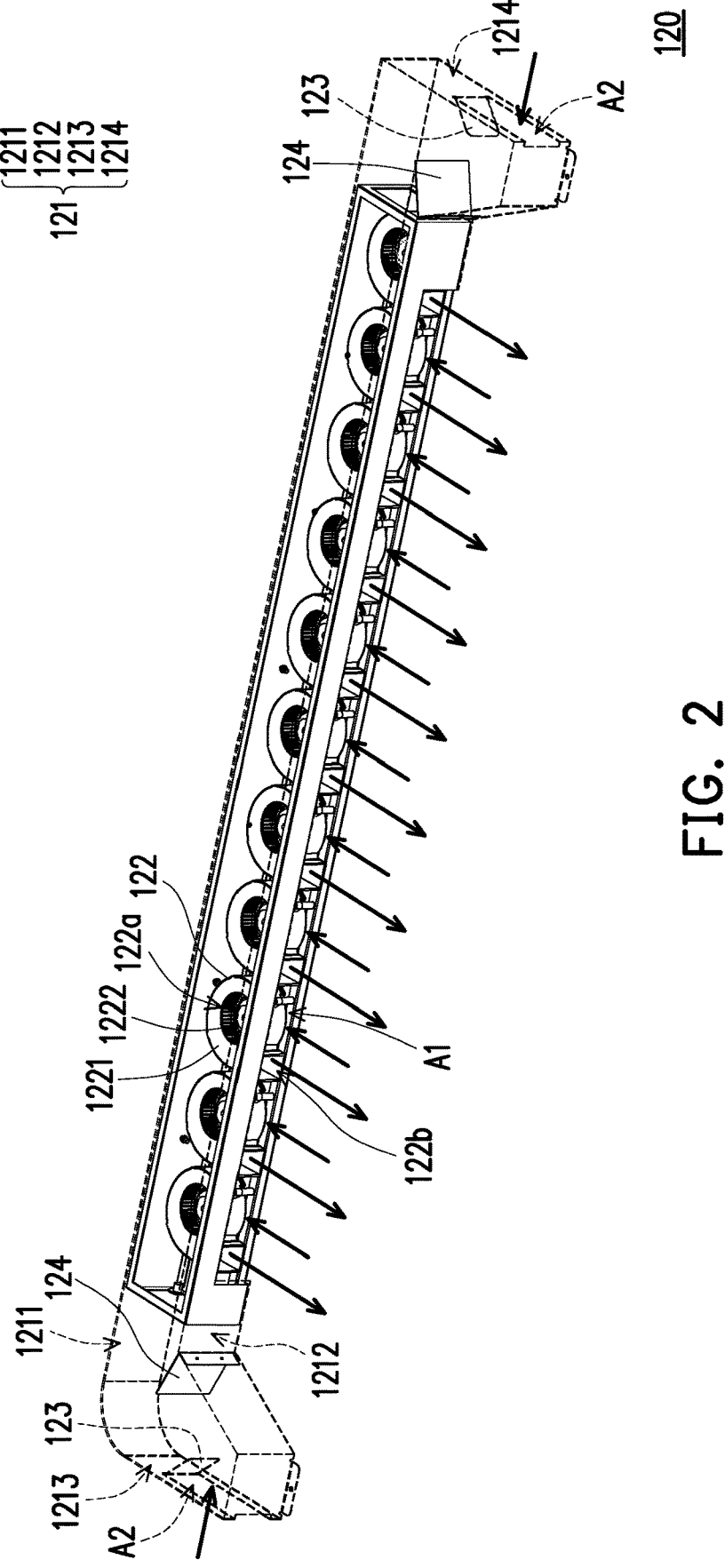
FIG. 2 is a schematic perspective view of the heat dissipation module of FIG. 1.
Figure 3:
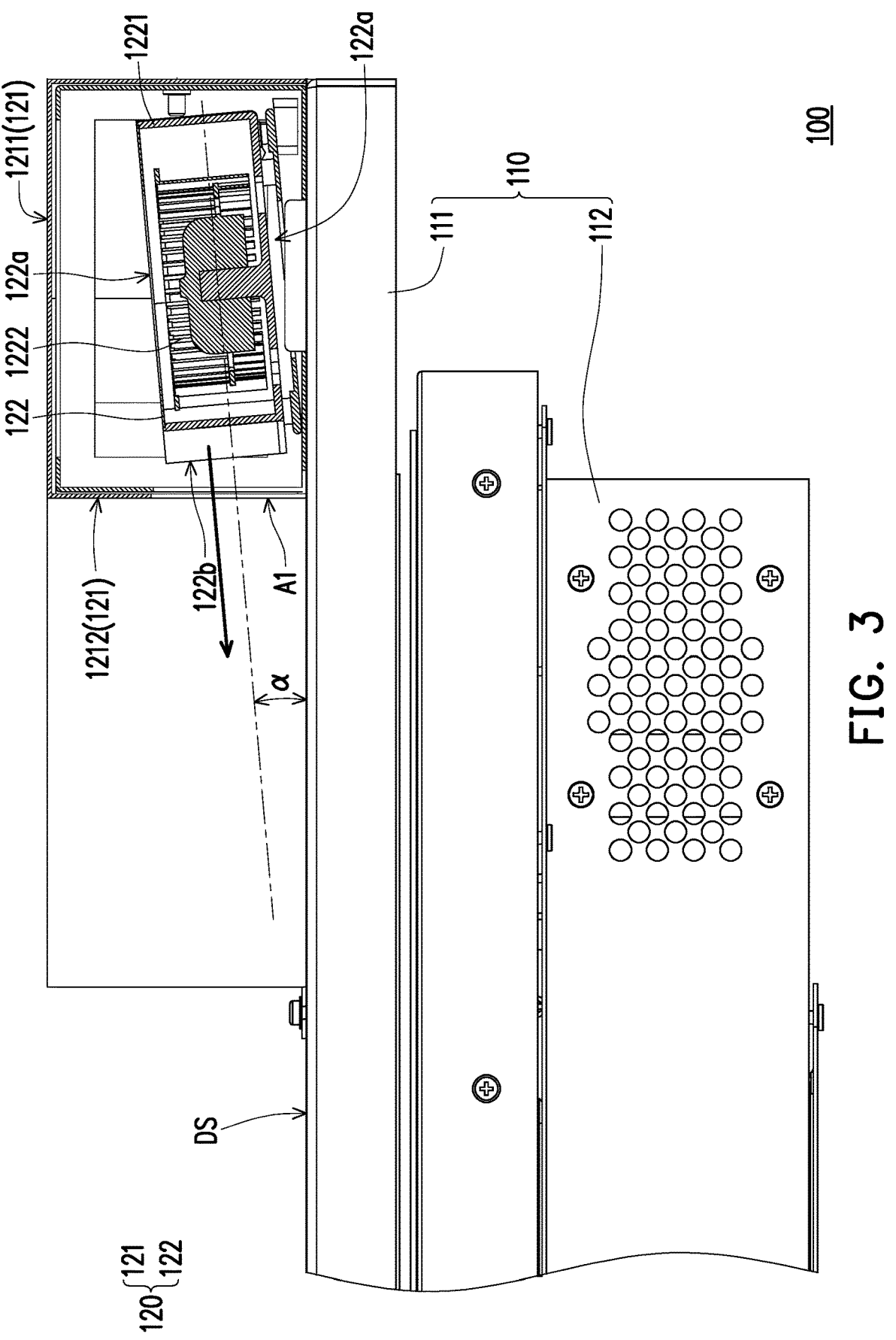
FIG. 3 is a schematic partial cross-sectional side view of the electronic device in FIG. 1.

FIG. 2 is a schematic perspective view of the heat dissipation module of FIG. 1. FIG. 3 is a schematic partial cross-sectional side view of the electronic device in FIG. 1. It should be noted that the casing of FIG. 2 is shown in a dotted line to clearly illustrate the internal elements thereof.

Please refer to FIG. 1 to FIG. 3, in the present embodiment, the heat dissipation module 120 includes a casing 121 and at least one first fan 122. In the present embodiment, the first fan 122 is a centrifugal first fan 122, the quantity of the air inlet portions 122*a* is two, and the air inlet portions 122*a* face each other. Specifically, the first fan 122 includes a volute 1221 and an impeller 1222, and the impeller 1222 is rotatably assembled in the volute 1221, but the invention is not limited thereto. In the present embodiment, the quantity of the first fan 122 shown is a plurality, and the plurality of first fans 122 are arranged parallel to a side of the display surface DS. In other embodiments, the quantity of the first fan may also be single, as long as the first fan may blow air towards the display surface DS to achieve cooling effect, the quantity of the first fan is within the protection scope of the invention, and the invention is not limited thereto.

In the present embodiment, the casing 121 has a first opening A1, and the first opening A1 faces the display surface DS. The first fan 122 is disposed inside the casing 121, the first fan 122 includes an air inlet portion 122*a* and an air outlet portion 122*b*, the air outlet portion 122*b* faces the first opening A1, and the air outlet angle of the air outlet portion 122*b* is slightly biased towards the display surface DS. Specifically, the first fan 122 has an angle α with the display surface DS in an extending direction perpendicular to the axial direction of the impeller 1222, and the design of the angle α may make the air outlet angle of the air outlet portion 122*b* be biased towards the display surface DS, but the invention is not limited thereto.

Under the above arrangement, ambient air outside the casing 121 flows into the air inlet portion 122*a* of the first fan 122 via the first opening A1. Specifically, the air outlet portions 122*b* of the first fans 122 are arranged at intervals with gaps between the air outlet portions 122*b*, and therefore ambient air outside the casing 121 may flow into the air inlet portions 122*a* of the first fans 122 from the first opening A1 through the gaps. The airflow generated by the first fans 122 flows out of the casing 1211 after passing through the first opening A1 from the air outlet portions 122*b* to flow towards the display surface DS. In this way, when the electronic device 100 is mounted outdoors, the heat dissipation module 120 may form an airflow on the display surface DS of the display 111 to directly cool the display surface DS to achieve the effect of heat dissipation. Moreover, since the air outlet 122 also has an air intake function in addition to an air outlet function, the airflow from the air outlet portions 122*b* generates turbulent flow on the upper half of the display surface DS close to the casing 121, thereby improving cooling effect.

Specifically, in the present embodiment, the casing 121 has a first side cover 1211 and a second side cover 1212 perpendicular to each other, the first side cover 1211 is parallel to the display surface DS and stacked on the at least one air inlet portion 122*a* of the at least one first fan 122, and the second side cover 1212 is extended along the normal direction of the display surface DS and connected to the first side cover 1211. In the present embodiment, the first opening A1 is located at the second side cover 1212, but the invention is not limited thereto.

In the present embodiment, the casing 121 further has a third side cover 1213 and a fourth side cover 1214 opposite to each other, and the third side cover 1213 and the fourth side cover 1214 are connected to two opposite sides of the first side cover 1211 and perpendicular to the display surface DS and the second side cover 1212.

In the present embodiment, the casing 121 further has at least one second opening A2, and ambient air outside the casing 121 flows into the air inlet portion 122*a* of the first fan 122 via the second opening A2. In detail, in the present embodiment, the quantity of the second opening A2 is two, and the two second openings A2 are respectively disposed at the third side cover 1213 and the fourth side cover 1214.

In the present embodiment, the airflow direction of the heat dissipation module 120 flowing in via the second opening A2 is perpendicular to the airflow direction of the heat dissipation module 120 flowing out of the first opening A1, but the invention is not limited thereto. In the present embodiment, the area of the at least one second opening A2 is less than the area of the first opening A1, but the invention is not limited thereto.

In the present embodiment, the heat dissipation module 120 further includes two first retaining walls 123 disposed in the casing 121. Specifically, the two first retaining walls 123 are respectively connected to the peripheral edges of the two second openings A2, and the two first retaining walls 123 are respectively inclined to the third side cover 1213 and the fourth side cover 1214. In this way, the first retaining walls 123 may detour the path of the flow channel and achieve the function of blocking rain or dust. In an embodiment, the heat dissipation module 120 also includes two second retaining walls 124 disposed in the casing 121 to maintain the cross-sectional area of the flow channel. In fact, the design of the cross-sectional area of the flow channel may be adjusted according to actual needs, but the invention is not limited thereto.

Other embodiments are listed below for illustration. It should be mentioned that, the embodiments below use the same reference numerals and portions of the content from previous embodiments. Specifically, the same reference numerals are used to represent the same or similar elements, and the descriptions for the same techniques are omitted. The omitted portions are as described in the embodiments above and are not repeated in the embodiments below.

Figure 4:
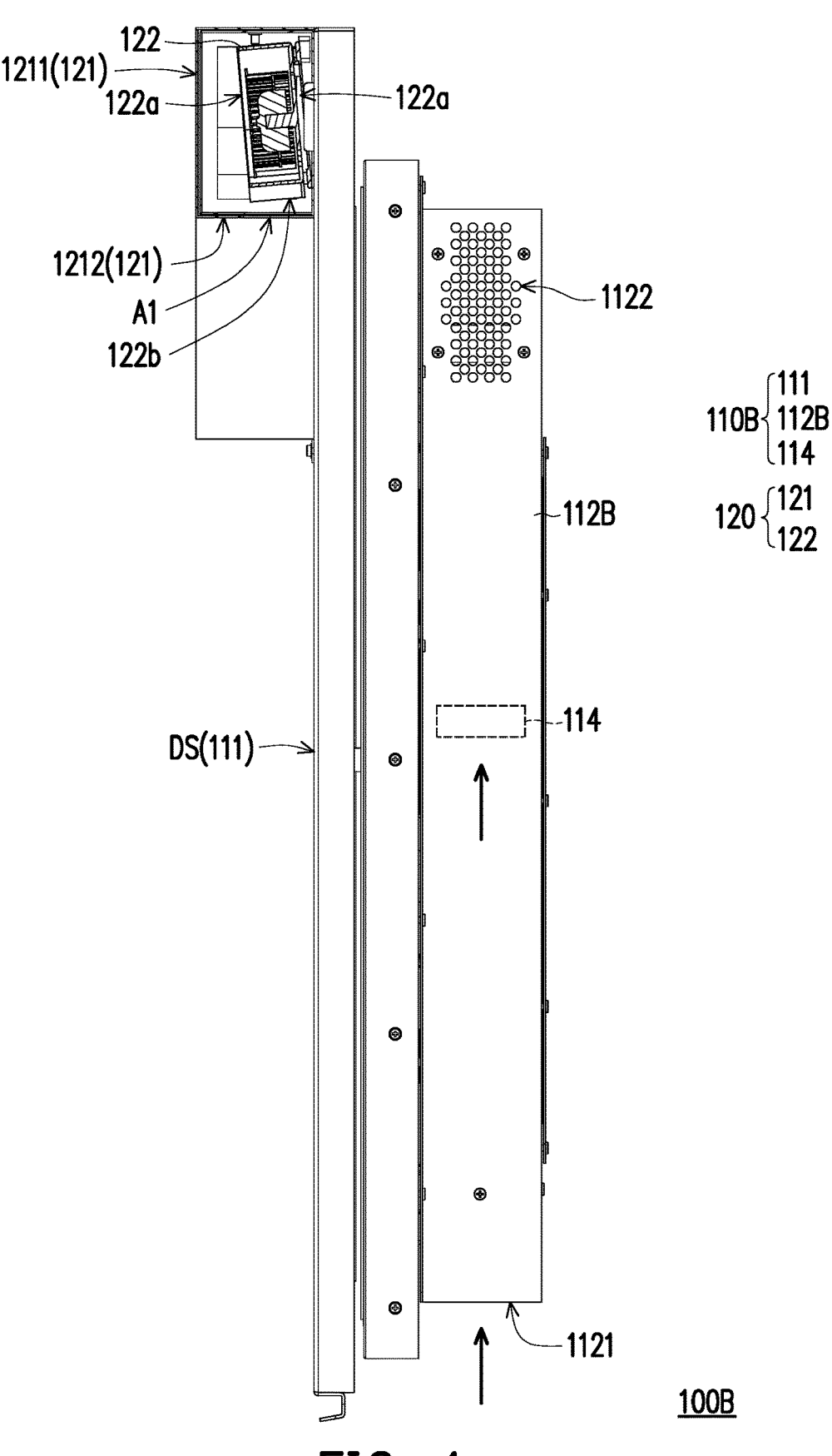
FIG. 4 is a schematic side view of an electronic device of another embodiment of the invention.

FIG. 4 is a schematic side view of an electronic device of another embodiment of the invention. In the present embodiment, a body 110B of an electronic device 100B includes a chassis 112B and a second fan 114. The chassis 112B is connected to the display 111 and located at the opposite side of the display surface DS, and the second fan 114 is disposed in the chassis 112B.

In the present embodiment, the chassis 112 includes an air inlet 1121 and an air outlet 1122, the air outlet 1122 is located at an end of the chassis 112 adjacent to the heat dissipation module 120, and the air inlet 1121 is located at another end of the chassis 112 away from the heat dissipation module 120, wherein airflow is adapted to flow into the chassis 112B from the air inlet 1121 and flow out from the chassis 112B via the air outlet 1122 to cool the inside of the AIO.

Accordingly, the second fan 114 is schematically shown by a dotted line. As long as the second fan 114 may bring the airflow from the air inlet 1121 to the air outlet 1122, the second fan 114 is within the protection scope of the invention, and the actual form thereof is not limited in the invention.

Since there may be dust, microparticles, moisture, garbage, etc., in the air, in the present embodiment, the air inlet 1121 is located at the concave surface facing downwards at the rear of the chassis 112B. By drawing air upwards, the air inlet 1121 may reduce the inhalation of unintended substances.

Figure 5A:
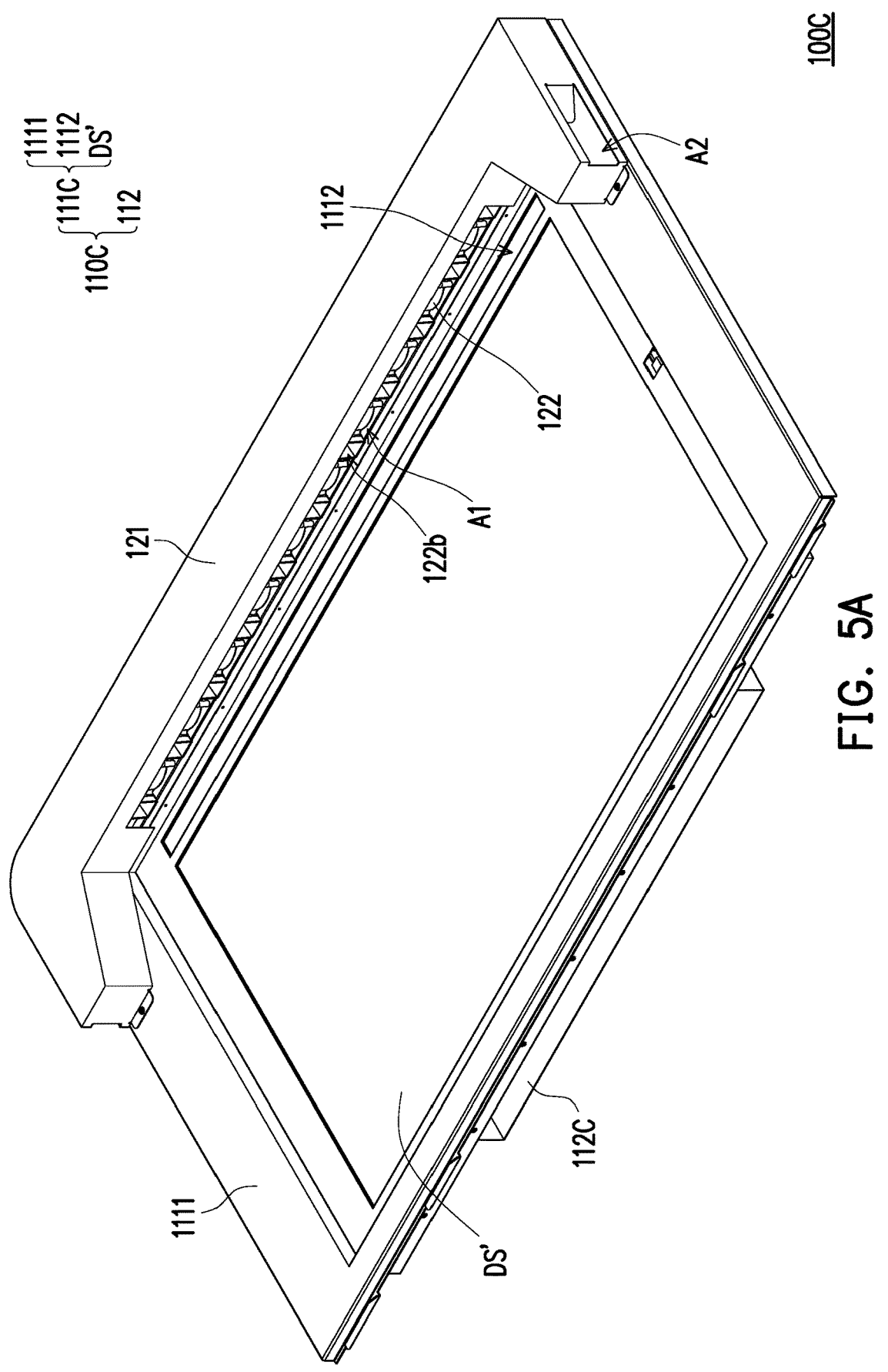
FIG. 5A is a schematic perspective view of an electronic device of another embodiment of the invention.
Figure 5B:
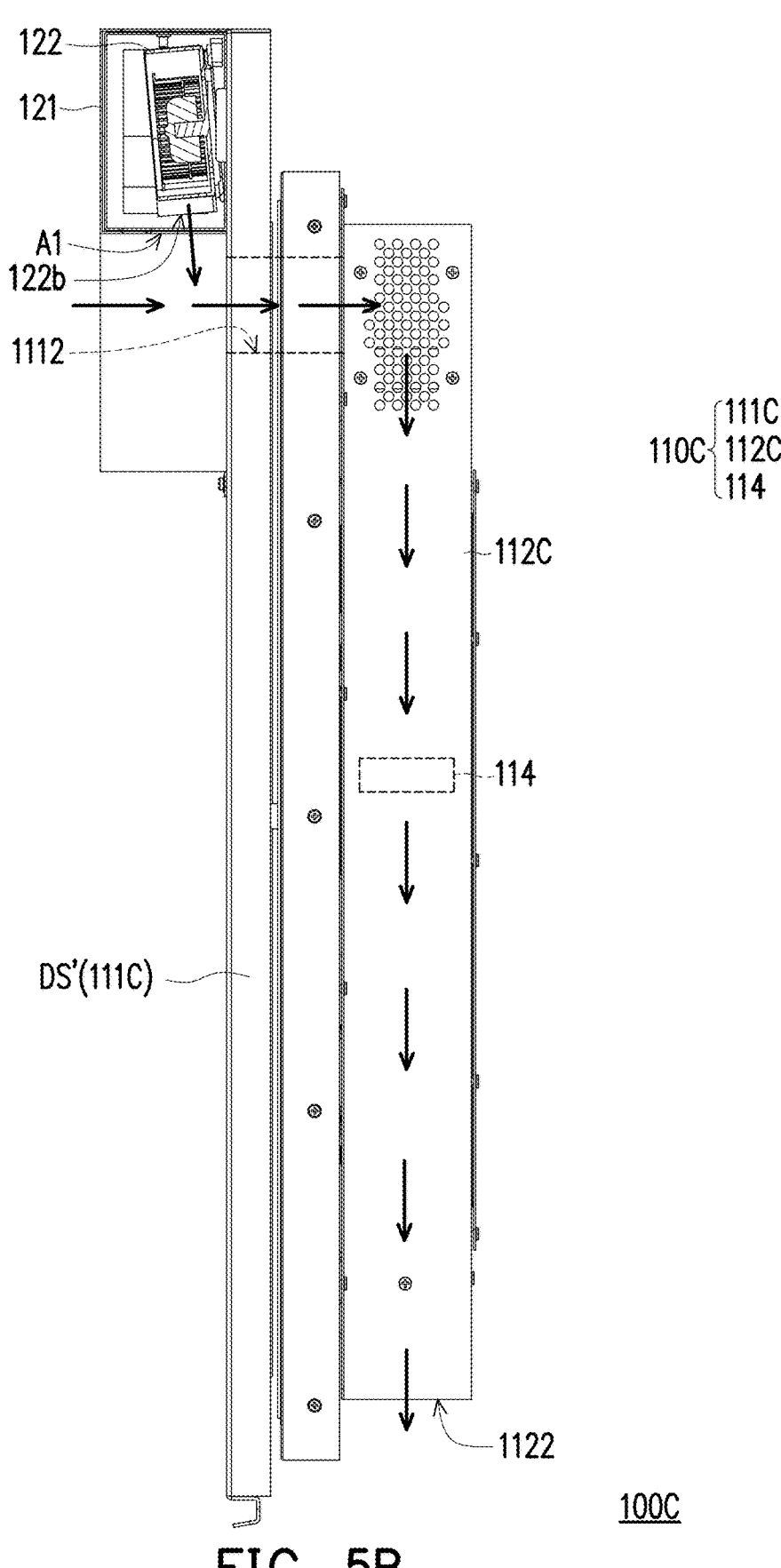
FIG. 5B is a schematic partial cross-sectional side view of the electronic device in FIG. 5A.

FIG. 5A is a schematic perspective view of an electronic device of another embodiment of the invention. FIG. 5B is a schematic partial cross-sectional side view of the electronic device in FIG. 5A. In the present embodiment, a display 111C of an electronic device 100C further includes an air inlet slot 1112, the air inlet slot 1112 is disposed at an outer periphery of a display surface DS' and located between the display surface DS' and the first opening A1, the display 111 is in an air communication state with a chassis 112C via the air inlet slot 1112, the chassis 112C includes the air outlet 1122, and the air outlet 1122 is located at an end of the chassis 112C away from the heat dissipation module 120, wherein airflow is adapted to flow into a body 110C from the air inlet slot 1112 and flow out from the chassis 112C via the air outlet 1122.

In the present embodiment, the air inlet slot 1112 is located at the inner side of the lower air outlet 1122 and may block rainwater via the casing 121 above, and form a shield using the airflow blown down by the first fan 122 in the casing 121 to reduce the garbage, dust, microparticles, moisture, etc., sucked by the air inlet slot 1112. In the present embodiment, the air inlet slot 1112 is a strip-shaped through slot to allow the airflow to flow from the front of the display 111 to the chassis 112C. However, in the present embodiment, the quantity of the air inlet slot may also be a plurality, and the quantity and the shape of the air inlet slot may be adjusted according to actual needs, and the invention is not limited thereto.

Based on the above, in the electronic device of the invention, the heat dissipation module is disposed above the display, and the airflow generated by the first fan of the heat dissipation module flows out of the casing after passing through the first opening from the air outlet portion to flow towards the display surface of the display. In this way, the heat dissipation module may directly cool the display surface to achieve the effect of heat dissipation. In an embodiment of the invention, the quantity of the first fan is a plurality. Since the air outlet portions of the first fans are arranged at intervals with gaps between the air outlet portions, ambient air may flow into the air inlet portions of the first fans from the first opening through the gaps. In this way, the air outlet also has an air intake effect, so the airflow from the air outlet portion generates turbulent flow on the upper half of the display surface, thereby improving cooling effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electronic device, comprising:
a body comprising a display, and the display has a display surface; and
a heat dissipation module disposed on the display and comprising:
a casing having a first opening, and the first opening faces the display surface; and
at least one first fan disposed in the casing, wherein the at least one first fan comprises at least one air inlet portion and at least one air outlet portion, the at least one air outlet portion faces the first opening, and an airflow generated by the at least one first fan flows out of the casing after passing through the first opening from the at least one outlet portion to flow towards the display surface,
an ambient air outside the casing flows into the at least one air inlet portion of the at least one first fan via the first opening.

2. The electronic device of claim 1, wherein the casing has at least one second opening, and the ambient air outside the casing flows into the at least one air inlet portion of the at least one first fan via the at least one second opening.

3. The electronic device of claim 2, wherein an airflow direction of the heat dissipation module flowing in via the at least one second opening is perpendicular to an airflow direction of the heat dissipation module flowing out of the first opening.

4. The electronic device of claim 2, wherein an area of the at least one second opening is less than an area of the first opening.

5. The electronic device of claim 2, wherein the casing has a first side cover and a second side cover perpendicular to each other, the first side cover is parallel to the display surface and stacked on the at least one air inlet portion of the at least one first fan, the second side cover is extended along a normal direction of the display surface and connected to the first side cover, and the first opening is located at the second side cover.

6. The electronic device of claim 5, wherein the casing has a third side cover and a fourth side cover opposite to each other, and the third side cover and the fourth side cover are connected to two opposite sides of the first side cover and perpendicular to the display surface and the second side cover.

7. The electronic device of claim 6, wherein the heat dissipation module further comprises two first retaining walls disposed in the casing.

8. The electronic device of claim 7, wherein a quantity of the at least one second opening is two, the two second openings are respectively disposed at the third side cover and the fourth side cover, the two first retaining walls are respectively connected to peripheral edges of the two second openings, and the two first retaining walls are respectively inclined to the third side cover and the fourth side cover.

9. The electronic device of claim 1, wherein the body further comprises a chassis and a second fan, the chassis is connected to the display and located at an opposite side of the display surface, and the second fan is disposed in the chassis.

10. The electronic device of claim 9, wherein the chassis comprises an air inlet and an air outlet, the air outlet is located at an end of the chassis adjacent to the heat dissipation module, and the air inlet is located at another end of the chassis away from the heat dissipation module, wherein an airflow is adapted to flow into the chassis from the air inlet and flow out from the chassis via the air outlet.

11. The electronic device of claim 9, wherein the display further comprises an air inlet slot, the air inlet slot is disposed at an outer periphery of the display surface and located between the display surface and the first opening, the display is in an air communication state with the chassis via the air inlet slot, the chassis comprises an air outlet, and the air outlet is located at an end of the chassis away from the heat dissipation module, wherein an airflow is adapted to flow into the body from the air inlet slot and flow out from the chassis via the air outlet.

12. The electronic device of claim 1, wherein the at least one first fan is a centrifugal first fan.

13. The electronic device of claim 1, wherein the at least one first fan comprises at least one volute and at least one impeller, and the at least one impeller is rotatably assembled in the at least one volute.

14. The electronic device of claim 1, wherein a quantity of the at least one air inlet portion is two, and the two air inlet portions are opposite to each other.

15. The electronic device of claim 1, wherein a quantity of the at least one first fan is a plurality, and the first fans are arranged parallel to a side of the display surface.

16. The electronic device of claim 15, wherein the air outlet portions of the first fans are arranged at intervals with gaps between the air outlet portions, and the ambient air outside the casing flows into the air inlet portions of the first fans from the first opening through the gaps.

17. The electronic device of claim 1, wherein the display comprises a frame, the frame surrounds the display surface, and the heat dissipation module is disposed on the frame.

18. The electronic device of claim 1, wherein the electronic device is an AIO computer.

19. The electronic device of claim 1, wherein the display surface is a touch display surface.

20. The electronic device of claim 1, wherein an air outlet angle of the at least one air outlet portion is biased towards the display surface.

\* \* \* \* \*